(12) United States Patent
Jeong et al.

(10) Patent No.: US 7,245,138 B2
(45) Date of Patent: Jul. 17, 2007

(54) POGO PIN AND TEST SOCKET INCLUDING THE SAME

(75) Inventors: Hyeck-Jin Jeong, Chungcheongnam-do (KR); Jung-Hyun Park, Chungcheongnam-do (KR); Heui-Seog Kim, Chungcheongnam-do (KR); Jong-Keun Jeon, Chungcheongnam-do (KR); Seok-Young Yoon, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/325,145

(22) Filed: Jan. 3, 2006

(65) Prior Publication Data
US 2006/0145719 A1    Jul. 6, 2006

(30) Foreign Application Priority Data
Jan. 5, 2005    (KR) .................. 10-2005-0000811

(51) Int. Cl.
*G01R 31/02* (2006.01)
(52) U.S. Cl. .................. 324/761; 324/754; 324/755
(58) Field of Classification Search ..................... None
See application file for complete search history.

(56) References Cited

U.S. PATENT DOCUMENTS 5,171,290 A * 12/1992 Olla et al. .................. 439/71
6,204,680 B1 * 3/2001 Swart et al. ................ 324/761
6,380,755 B1 * 4/2002 Sato ........................... 324/765
6,486,690 B1 * 11/2002 Takagi et al. ............... 324/763
6,524,115 B1 * 2/2003 Gates et al. ................. 439/66
6,574,114 B1 * 6/2003 Brindle et al. .............. 361/769
2004/0211061 A1 * 10/2004 Farnworth ................... 29/884

FOREIGN PATENT DOCUMENTS

| JP | 2003-084047 | 3/2003 |
| KR | 2001-111118 | 12/2001 |
| KR | 2003-010423 | 2/2003 |
| KR | 2003-0091216 | 12/2003 |
| KR | 20-0322060 | 8/2006 |
| WO | 2004/086565 | 10/2004 |

OTHER PUBLICATIONS

English language abstract of Korean Publication No. 2001-111118.
English language abstract of Korean Publication No. 2003-010423.
English language abstract of Japanese Publication No. 2003-084047.

* cited by examiner

*Primary Examiner*—Minh N. Tang
(74) *Attorney, Agent, or Firm*—Mager Johnson & McCollom, P.C.

(57) ABSTRACT

A POGO pin that can measure low frequency products as well as RF products and also have a long life span, and a test socket including the POGO pin are provided. The POGO pin includes a metal plunger formed of a conductive metal so as to electrically contact the semiconductor package, and a rubber contact pin connected with the metal plunger and formed of a conductive rubber so as to electrically contact the test board.

26 Claims, 2 Drawing Sheets

… (US 7,245,138 B2)

POGO PIN AND TEST SOCKET INCLUDING THE SAME

CROSS-REFERENCE TO RELATED PATENT APPLICATION

This application claims the benefit of Korean Patent Application No. 10-2005-0000811, filed on Jan. 5, 2005, in the Korean Intellectual Property Office, the disclosure of which is incorporated herein in its entirety by reference.

BACKGROUND OF THE INVENTION

1. Field of the Invention

The present invention relates to a semiconductor package reliability tester, and more particularly, to a POGO pin for testing the electrical characteristics of a semiconductor package and a test socket including the POGO pin.

2. Description of the Related Art

Semiconductor devices that have undergone patterning processes are subjected to an electrical die sorting (EDS) test using a probe unit. After the EDS test, the semiconductor devices are packaged in semiconductor packages via a series of packaging processes. Then, the semiconductor packages are electrically tested using a test socket before they are shipped as products to be sold. The test socket, whose construction and shape may be changed depending on the type or shape of the package to be tested, is used to electrically connect a semiconductor device with a tester board.

FIG. 1 is a sectional view showing a conventional POGO pin 30 positioned between a test board 20 and semiconductor package 10 for testing of the electrical characteristics of the semiconductor package.

Referring to FIG. 1, in a conventional electrical characteristic test, a POGO pin 30 electrically connects a semiconductor package 10 that is being tested with a test board 20. The conventional semiconductor package 10 shown includes a ball grid array (BGA) package having solder balls attached on a surface thereof may be used. The test board 20 supplies the semiconductor package 10 with a test voltage, a test current, a test signal, and the like to precisely determine whether the semiconductor package 10 has an operation failure.

The POGO pin 30 is built into a test socket (see 100 of FIG. 4) and is interposed between the semiconductor package 10 and the test board 20. The POGO pin 30 electrically connects the semiconductor package 10 with the test board 20, as between an electrical terminal 22 on the test board 20 and the solder ball 12 on the semiconductor package 10 to be tested. The POGO pin 30 includes a bar-shaped plunger 35 having a high conductivity and a coil spring 37 wound about a lower portion of the POGO 30.

The plunger 35 includes an upper plunger 32 and a lower plunger 34 formed integrally with the upper plunger 32, with the upper plunger 32 being larger in diameter than the lower plunger 34. The upper plunger 32 has a protruded stopper 33 at a predetermined portion thereof, i.e., at the portion where the upper plunger 32 is connected with the lower plunger 34. The protruded stopper 33 is larger in diameter than the upper plunger 32. The upper plunger 32 also has equiangular protrusions 31 formed at an end thereof so as to facilitate its contact with the solder balls 12. The lower plunger 34 is inserted inside the coil spring 37 which in an unbiased position extends past the end of lower plunger 34 to contact an electrical terminal 22 of the test board 20.

One drawback of the convention POGO pin 30 as shown in FIG. 1 is problems incurred when shorter contacting test pins are required. If the conventional POGO pin 30 is manufactured having a length below 3 mm, the life span of the POGO pin 30 is severely shortened, making it difficult to use. However, it is preferable that the POGO pin 30 be short when testing radio frequency (RF) products. This is because RF signals are greatly affected by parasitic inductance and capacitance. Accordingly, the conventional POGO pin 30 is not suitable for testing RF products.

An alternate design for RF testing known in the art includes using a conductive rubber member. FIG. 2 is a sectional view illustrating such an alternate design using a unitary rubber contact pin 50.

Referring to FIG. 2, the rubber contact pin 50 includes a first contact pin 51 contacting a solder ball 12 of a semiconductor package 10, and a second contact pin 55 opposing the first contact pin 51 and contacting an electrode terminal 22 of a test board 20. The first contact pin 51 and the second contact pin 55 are connected to each other by a conductive rubber member 53 having an elastic force and formed of a mixture of silicon rubber and a conductive powder.

Because the rubber contact pin 50 is short in length, it is possible to sufficiently test RF products. Also, the rubber contact pin 50 has the advantage of being able to precisely contact all packages—even a package without a solder ball design—for example, a line grid array (LGA) package. However, the rubber contact pin 50 used in the prior art has the disadvantage of a short life span due to use of the rubber material.

SUMMARY OF THE INVENTION

The present invention is intended to address the drawbacks of the prior art in providing a POGO pin for electrical testing of semiconductor packages incorporating low-frequency or RF designs while still being sufficiently durable to maintain an adequate life span.

According to an aspect of the present invention, there is provided a POGO pin of a test socket for electrically connecting a semiconductor package with a test board, including: a metal plunger formed of a conductive metal so as to electrically contact the semiconductor package; and a rubber contact pin connected with the metal plunger and formed of a conductive rubber so as to electrically contact the test board.

The above POGO pin may further include a conductive protection sheet having a protrusion formed on a surface thereof so as to seamlessly connect the metal plunger with the rubber contact pin. The conductive protection sheet may include a silicon rubber and conductive particles and be between 0.05–0.2 mm thick.

The metal plunger of the inventive POGO pin is preferably be 0.3–3.0 mm long. The metal plunger may have a plurality of equiangular protrusions formed on an upper end surface thereof such that the upper end surface of the metal plunger reliably contacts a connection terminal of the semiconductor package.

The rubber contact pin is preferably formed of a silicon rubber containing a conductive powder. The rubber contact pin may be 0.15–1.0 mm thick and the entire pin itself between about 0.45 and 4.2 mm long.

According to another aspect of the present invention, there is provided a test socket including: a housing having a first through hole; a guide part coupled inside the housing and having a second through hole connected with the first through hole; and a POGO pin received in the first and second through holes and adapted to electrically connecting a semiconductor package with a test board, wherein the POGO pin includes: a metal plunger formed of a conductive metal so as to electrically contact the semiconductor package; and a rubber contact pin connected with the metal plunger and formed of a conductive rubber so as to electrically contact the test board.

The first through hole may include: a small diameter portion disposed toward the semiconductor package and having a first diameter; a large diameter portion disposed toward the rubber contact pin and having a second diameter larger than the first diameter; and a stepped portion disposed between the small diameter portion and the large diameter portion.

The second through hole may be in contact with the rubber contact pin and has a diameter that can receive the rubber contact pin.

The stepped portion is adapted to limit the movement of the metal plunger so that it is not pushed out through the back side of the receiving aperature.

The rubber contact pin may be equal to or less in diameter than the large diameter portion of the first through hole.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 4:
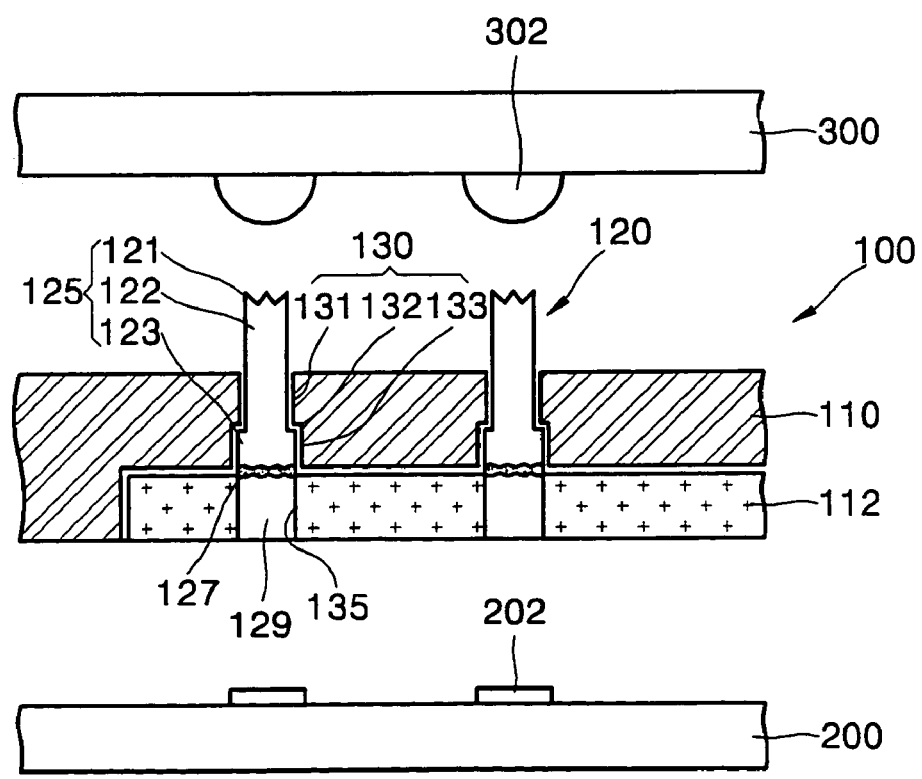
FIG. 4 is a sectional view illustrating a test socket package integrating the POGO pin of FIG. 3 to test the electrical characteristics of a semiconductor package.

The present invention relates to a POGO pin 120 of a test socket (see 100 of FIG. 4). A method for mounting the POGO pin 120 in the test socket 100 can be variously modified without being limited to the following embodiment.

Figure 1:
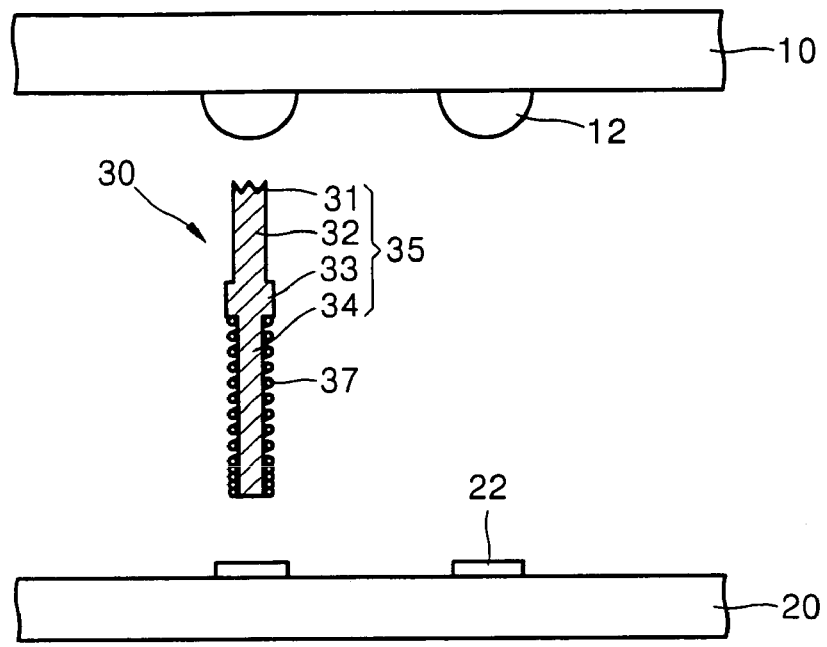
FIG. 1 is a sectional view illustrating a POG pin known in the prior art in use to test the electrical characteristics of a semiconductor package.
Figure 2:
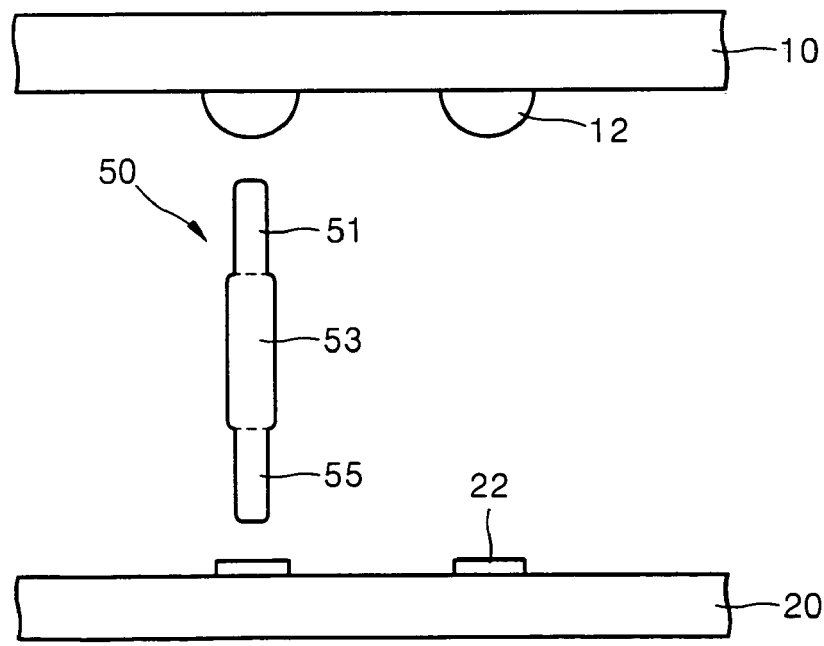
FIG. 2 is a sectional view illustrating a contact testing pin in an alternate prior art configuration including a unitary rubber contact pin for testing the electrical characteristics of a semiconductor package.
Figure 3:
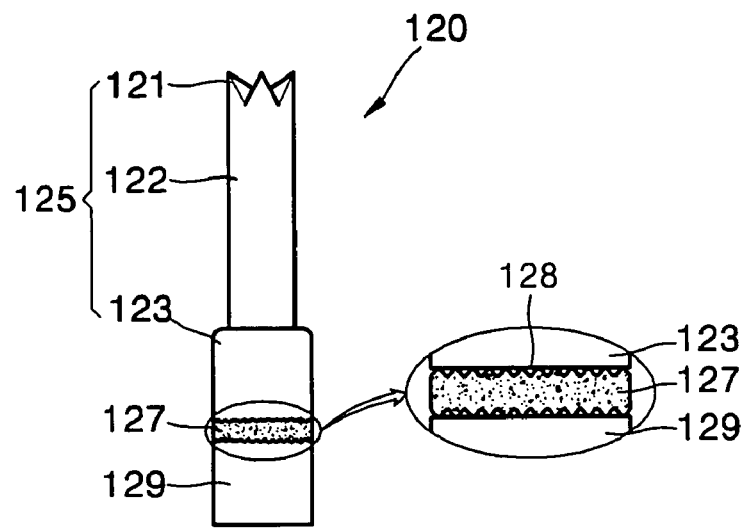
FIG. 3 is a perspective view of a POGO pin configured according to a preferred embodiment of the present invention.

FIG. 3 is a perspective view of a POGO pin according to the present invention. Referring to FIG. 3, the POGO pin 120 includes a metal plunger 125 electrically contacting a semiconductor package, and a rubber contact pin 129 coupled to the metal plunger 125 and electrically contacting a test board. The metal plunger 125 in the embodiment shown has a rod shape with a particular diameter, although it is understood that plunger 125 can be laterally dimensioned to accommodate a variety of different cross-sections without departing from the spirit of the invention. The metal plunger 125 has a protruded stopper 123 at an end thereof, the stopper 123 being larger in diameter (or having a larger lateral dimension) than a main body 122 of the metal plunger 125. The other end of the main body 122 of the metal plunger 125 has equiangular protrusions 121 to facilitate its contact with the semiconductor package. The metal plunger 125 is made of a conductive material, such as a copper-based alloy, for example, a beryllium copper or the like.

It is preferable that the rubber contact pin 129 be connected with the stopper 123 of the metal plunger 125 and be shaped in a rod that is equal to or less in diameter than the stopper 123. It will be appreciated, however, that stopper 123 and contact pin 129 can also have different cross sections so that stopper 123 does not move upward and completely out of the housing aperture 131 as illustrated in FIG. 4. That is, the contact pin 129 movement is limited to a downward direction upon contact with the semiconductor package 300 to be tested.

The rubber contact pin 129 has a conductivity, and is formed, for example, of a mixture of silicon rubber and a conductive powder. The conductive powder mixed with the silicon rubber is preferably comprised of a nickel powder coated with gold, has a diameter ranging from 10 µm to 60 µm, and has a preferred mixing ratio of silicon rubber to nickel powder coated with gold of between about 1:2 to 1:3.

A method of manufacturing the rubber contact pin 129 using silicon rubber will now be described. A cylinder (not shown) defining a diameter of the rubber contact pin 129 is first prepared. Thereafter, nickel powder coated with gold and having a diameter ranging from 10 µm to 60 µm is poured into the cylinder at a desired mixing ratio. Gel type silicon rubber is supplied to the cylinder receiving the nickel powder, and is then mixed with the nickel powder. Then, the mixture of the nickel powder and the silicon rubber is hardened.

Since the rubber contact pin 129 according to the present invention uses a silicon rubber (having a superior elasticity) and a nickel powder coated with gold (having a high conductivity), the resulting pin has an electrical characteristic with almost no coil component. Since the rubber contact pin 129 has with no almost coil component, its inductance and capacitance decrease, which is very advantageous when conducting an electrical characteristic test of an RF circuit.

In an alternate implementation of the contact pin 120, a conductive protection sheet 127 is interposed between the metal plunger 125 and the rubber contact pin 129 to enable seemly contact. In one example, the seamless contact can be performed by forming protrusions 128 on a surface of the protection sheet 127. The number, size, and arrangement of the protrusions formed on the surface of the protection sheet 127 can be variously determined according to kind or size of the POGO pin 120. The conductive protection sheet 127 can be formed of the mixture of silicon rubber and conductive particles as in the case of the aforementioned rubber contact pin 129, but its formation is not necessarily limited thereto. The thickness of the conductive protection sheet 127 influences the overall length of the POGO pin 120, and preferably ranges from between 0.05 mm and 0.2 mm.

The length of the POGO pin 120 may be varied according to kinds of packages to be measured, and preferably ranges from between about 0.45 mm to 4.2 mm. If the POGO pin 120 is short, it is preferable that the POGO pin 120 be used for testing a high frequency package. If the POGO pin 120 is long, it is preferably that the POGO pin 120 be used for testing a low frequency package. In particular, since the POGO pin 120 uses the rubber contact pin 129, it is advantageous in measuring an RF package and can also greatly enhance the contact capability between the POGO pin 120 and the test board 200. In other words, the POGO pin 120 enables a favorable contact between the low frequency package and the test board 200. Given the desired length of the POGO pin 120 of the present invention, the metal plunger 125 is approximately 0.3–3.0 mm long and the rubber contact pin 129 is 0.15–1.0 mm long.

FIG. 4 is a sectional view illustrating the testing of the electrical characteristics of a semiconductor package 300 using a test socket 100 including a POGO pin 120 according to an embodiment of the present invention.

Referring to FIG. 4, the test socket 100 includes a housing 110 having a plurality of first through holes 130, and a guide part 112 having a plurality of second through holes 135, their respective diameters being greater than those of the first through holes 130. The POGO pin 120 is received in the first through hole 130 and the second through hole 135 to electrically connect the semiconductor package 300 with the test board 200.

The first through hole 130 receiving the metal plunger 125 therein includes a small diameter portion 131 of a first diameter, disposed toward the semiconductor package 300, and a large diameter portion 133 of a second diameter that is larger than the first diameter, disposed toward the rubber contact pin 129. Alternatively, a stepped portion 132 may be formed between the small diameter portion 131 and the large diameter portion 133. An upward movement of the metal plunger 125 is stopped when the stopper 123 is engaged by the stepped portion 132. Accordingly, the stopper 123 and the stepped portion 132 prevent the POGO pin 120 from disengaging to the outside.

The second through hole 135 is equal to or less in diameter than the large diameter portion 133 such that the second through hole 135 can contact and receive the rubber contact pin 129. Accordingly, the diameter of the rubber contact pin 129 may be equal to or less than that of the large diameter portion 133.

According to a method of measuring the electrical characteristics of the semiconductor package 300, the test socket 100 is first mounted on the test board 200. Thereafter, electrode terminals 202 of the test board 200 are made to contact the rubber contact pin 129 of the test socket 100, and a pressure is applied to an upper surface of the semiconductor package 300. At this time, the POGO pin 120 is moved upward until the POGO pin 120 is latched on the stepped portion 132 by the elasticity of the rubber contact pin 129. The protrusions 121 of the metal plunger 125 are made to contact with the solder balls 302 of the semiconductor package 300. As the pressure continues to be applied to the semiconductor package 300, the rubber contact pin 129 closely contacts the electrode terminal 202 and the protrusions 121 closely contact the solder ball 302. The electrical characteristics of the semiconductor package are tested in a state where the test socket 100 closely contacts the test board 200 and the semiconductor package 300.

Since the POGO pin constructed according to the invention uses the rubber contact pin and the metal plunger formed integrally, it is possible to measure the electrical characteristic from an RF band to a low frequency band, and the life span of the POGO pin increases. The rubber contact pin further enables a seamless contact between the POGO pin and the test board.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A POGO pin of a test socket for electrically connecting a semiconductor package with a test board, comprising:
    an inelastic conductive section adapted to electrically contact a semiconductor package; and
    an elastic conductive section formed of a conductive rubber coupled to the inelastic conductive section for contacting a test board so that test signals passed through the elastic conductive section from the test board are transmitted to the inelastic conductive section and thence to the semiconductor package to be tested.

2. The POGO pin of claim 1, wherein the inelastic conductive section includes a plunger formed of a conductive metal.

3. The POGO pin of claim 2, wherein the conductive metal is a copper-based alloy.

4. The POGO pin of claim 3, wherein the copper-based alloy is beryllium copper.

5. The POGO pin of claim 1, further including a stopper interposed between the elastic conductive section and inelastic conductive section and having a larger lateral dimension than said inelastic conductive section.

6. The POGO pin of claim 1, further comprising a conductive protection sheet having a protrusion formed on a surface thereof so as to seamlessly connect the inelastic conductive section with the elastic conductive section.

7. The POGO pin of claim 6, wherein the conductive protection sheet comprises a silicon rubber and conductive particles.

8. The POGO pin of claim 6, wherein the conductive protection sheet is 0.05–0.2 mm thick.

9. The POGO pin of claim 1, wherein the inelastic conductive section is 0.3–3.0 mm long.

10. The POGO pin of claim 1, wherein the inelastic conductive section includes a metal plunger having a plurality of equiangular protrusions formed on an upper end surface thereof such that the upper end surface of the metal plunger reliably contacts a connection terminal of the semiconductor package.

11. The POGO pin of claim 1, wherein the elastic conductive section includes a rubber contact pin formed of a silicon rubber containing a conductive powder.

12. The POGO pin of claim 11, the conductive powder being a nickel powder coated with gold.

13. The POGO pin of claim 12, the nickel powder coated with gold having a diameter of between 10 and 60 μm.

14. The POGO pin of claim 12, the mixing ratio of the silicon rubber to the nickel powder coated with gold being between 1:2 and 1:3.

15. The POGO pin of claim 11, wherein the rubber contact pin is 0.15–1.0 mm thick.

16. The POGO pin of claim 1, a combined length of the inelastic conductive section and the elastic conductive section being 0.45–4.2 mm long.

17. A test socket comprising:
    a housing having a first through hole;
    a guide part coupled inside the housing and having a second through hole connected with the first through hole; and a POGO pin received in the first and second through holes for electrically connecting a semiconductor package with a test board, wherein the POGO pin comprises:

a metal plunger formed of a conductive metal so as to electrically contact the semiconductor package; and a rubber contact pin connected with the metal plunger and formed of a conductive rubber so as to electrically contact the test board.

18. The test socket of claim 17, wherein the first through hole comprises:

a small diameter portion disposed toward the semiconductor package and having a first diameter;

a large diameter portion disposed toward the rubber contact pin and having a second diameter larger than the first diameter; and a stepped portion disposed between the small diameter portion and the large diameter portion.

19. The test socket of claim 17, wherein the second through hole is in contact with the rubber contact pin and has a diameter that receives the rubber contact pin.

20. The test socket of claim 18, wherein the stepped portion limits movement of the metal plunger.

21. The test socket of claim 17, further comprising a conductive protection sheet having a protrusion formed on a surface thereof so as to seamlessly connect the metal plunger with the rubber contact pin.

22. The test socket of claim 21, wherein the conductive protection sheet comprises a silicon rubber and a conductive powder.

23. The test socket of claim 18, wherein the rubber contact pin is equal to or less in diameter than the large diameter portion of the first through hole.

24. The test socket of claim 17, wherein the POGO pin is 0.45–4.2 mm long.

25. A POGO pin of a test socket for electrically connecting a semiconductor package with a test board, comprising:

an inelastic conductive section adapted to electrically contact a semiconductor package; and an elastic conductive section formed of a conductive rubber, integrally formed with the inelastic conductive section, for contacting a test board so that test signals passed through the elastic conductive section from the test board are transmitted to the inelastic conductive section and thence to the semiconductor package to be tested.

26. The POGO pin of claim 25, further including a stopper interposed between the elastic conductive section and inelastic conductive section and having a larger lateral dimension than said inelastic conductive section.

* * * * *

UNITED STATES PATENT AND TRADEMARK OFFICE
CERTIFICATE OF CORRECTION

| | | |
|---|---|---|
| PATENT NO. | : 7,245,138 B2 | Page 1 of 1 |
| APPLICATION NO. | : 11/325145 | |
| DATED | : July 17, 2007 | |
| INVENTOR(S) | : Hyeck-Jin Jeong et al. | |

It is certified that error appears in the above-identified patent and that said Letters Patent is hereby corrected as shown below:

Foreign Patent number KR 20-0322060, the date "8/2006" should read -- 8/2003 --.

Signed and Sealed this

Thirtieth Day of September, 2008

JON W. DUDAS
*Director of the United States Patent and Trademark Office*